United States Patent
Poon et al.

(10) Patent No.: US 7,319,191 B2
(45) Date of Patent: Jan. 15, 2008

(54) SIGNAL ADAPTER

(75) Inventors: King L. Poon, Missouri City, TX (US); James R. Harper, Richmond, TX (US)

(73) Assignee: Thermo Fisher Scientific Inc., Sugar Land, TX (US)

( * ) Notice: Subject to any disclaimer, the term of this patent is extended or adjusted under 35 U.S.C. 154(b) by 597 days.

(21) Appl. No.: 10/286,284

(22) Filed: Nov. 1, 2002

(65) Prior Publication Data

US 2003/0083038 A1 May 1, 2003

Related U.S. Application Data

(60) Provisional application No. 60/336,032, filed on Nov. 1, 2001.

(51) Int. Cl.
*H01J 15/00* (2006.01)
*H01J 5/00* (2006.01)

(52) U.S. Cl. ............................. 174/50.62; 174/50.63; 174/521; 361/118; 361/120

(58) Field of Classification Search ............ 174/50.52, 174/52.1, 50, 52, 50.62, 50.63, 521, 50.5; 73/35.17, 35.14; 361/118, 120
See application file for complete search history.

(56) References Cited

U.S. PATENT DOCUMENTS

| | | | | |
|---|---|---|---|---|
| 3,614,539 A * | 10/1971 | Hallenbeck | ................. | 361/837 |
| 3,701,877 A * | 10/1972 | Richardson | ................... | 219/97 |
| 3,775,551 A * | 11/1973 | Prehmus et al. | ............. | 174/542 |
| 4,345,290 A * | 8/1982 | Johnson | ........................ | 361/56 |
| 4,394,704 A * | 7/1983 | Jones | .......................... | 361/119 |
| 4,664,281 A * | 5/1987 | Falk et al. | .................... | 220/3.8 |
| 4,796,159 A * | 1/1989 | Miksche | ..................... | 361/832 |
| 4,840,194 A * | 6/1989 | Berry | .......................... | 138/155 |
| 5,534,664 A * | 7/1996 | Fearing et al. | ................. | 174/50 |
| 5,608,611 A * | 3/1997 | Szudarek et al. | ........... | 361/753 |
| 5,838,589 A * | 11/1998 | Nail et al. | ................... | 700/286 |
| 5,851,083 A * | 12/1998 | Palan | ......................... | 403/337 |
| 5,955,684 A * | 9/1999 | Gravel et al. | ............... | 73/866.5 |
| 6,037,857 A * | 3/2000 | Behrens et al. | ......... | 340/310.03 |
| 6,218,845 B1 * | 4/2001 | Bunch et al. | ................ | 324/601 |
| 6,249,415 B1 * | 6/2001 | Daoud et al. | ................ | 361/117 |
| 6,778,374 B2 * | 8/2004 | Berlovan et al. | ............ | 361/117 |
| 2007/0095554 A1 * | 5/2007 | Noda | ........................... | 174/55 |

* cited by examiner

*Primary Examiner*—Hung V. Ngo
(74) *Attorney, Agent, or Firm*—Osha Liang LLP

(57) ABSTRACT

A signal adapter comprising an explosion proof housing, a circuit member disposed on an inside of the explosion proof housing, a signal input connector electrically connected to the circuit member, a signal output connector electrically connected to the circuit member, and a seal disposed on the inside of the explosion proof housing and around the circuit member, creating an explosion proof seal between the signal input connector and the signal output connector.

17 Claims, 3 Drawing Sheets

SIGNAL ADAPTER

CROSS-REFERENCE TO RELATED APPLICATIONS

This application claims benefit from and incorporates by reference in its entirety U.S. Provisional Application No. 60/336,032, filed on Nov. 1, 2001.

BACKGROUND OF INVENTION

Background Art

At locations where oil or gas wells are being drilled, a number of flammable gases may be present, including mixtures of oxygen, methane, ethane, propane, hydrogen sulfide and others. Similar potentially dangerous conditions exist in locations in which petroleum products are being transported, recovered, refined, or processed. Likewise, dangerous conditions exist in other industrial areas where large quantities of dust are present, such as in grain handling facilities or pulp and paper mills. Standard classifications have been adopted by regulatory agencies based on the nature of the hazardous material that is generally present or may be present. Areas that defined as hazardous because of an explosion hazard are called "classified areas."

Often, electrical equipment must be used in classified areas. But electrical components may generate heat and sparks sufficient to ignite a flammable gas or other flammable mixture, even under normal operating conditions. Because of this danger, electrical components in a classified area must either be enclosed in an "explosion proof" container, or the electrical components themselves must be "intrinsically safe."

An "explosion proof" container is a container that is designed to enclose electrical devices that are capable of igniting an explosive material. The container must be capable of withstanding, without damage, an internal explosion of the hazardous material. By containing the internal explosion, an explosion proof container prevents the ignition of any explosive material surrounding the container. As a result, equipment and personnel outside the explosion proof container will remain safe.

An "intrinsically safe" device is an electrical device that is incapable of causing ignition of the flammable material under normal use or under any fault conditions likely to occur in practice. Specifically, intrinsically safe components must meet certain standards related to power consumption and storage, operating temperature, and current and voltage requirements. Essentially, an intrinsically safe device does not contain enough energy to ignite an explosive material.

In typical applications conducted in classified areas, it may be useful for such electrical devices to communicate with other electrical devices, both inside and outside the classified area. For example, the complicated nature of modern oil and gas drilling, production, or transportation requires that the data from multiple sensors be transmitted to a computer where it can be analyzed in real time. If the device that is transmitting data, for example a sensor in an oil and gas drilling operation, is not an intrinsically safe device, it must be enclosed in an explosion proof container, making effective communication difficult to achieve.

Current methods of communication include running a cable between the devices and enclosing the cable in an explosion proof conduit. These methods are much less desirable when the devices are not located close to each other, requiring extensive lengths of explosion proof conduit in the classified area. Another method is to run a cable in an explosion proof housing to a location outside the classified area. Once outside the classified area, a radio transceiver generates a radio signal, and an antenna transmits the signal to the desired device.

SUMMARY OF INVENTION

One aspect of the invention relates to a signal adapter comprising an explosion proof housing with a circuit member disposed on an inside of the explosion proof housing. A signal input connector is electrically connected to the circuit member, and a signal output connector is electrically connected to the circuit member. A seal is disposed on the inside of the explosion proof housing and around the circuit member, creating an explosion proof seal between the signal input connector and the signal output connector.

Another aspect of the invention relates to a method for providing an intrinsically safe signal. The method includes relaying a signal through a signal input, passing the signal through at least one capacitor, and outputting the intrinsically safe signal through a signal output.

Other aspects and advantages of the invention will be apparent from the following description and the appended claims.

DETAILED DESCRIPTION

The present invention relates to a signal adapter, and method, for use with a radio transceiver located within an explosion proof container. A signal adapter according to the invention outputs an intrinsically safe signal to an antenna or other device, while maintaining the integrity of an explosion proof container.

Figure 1:
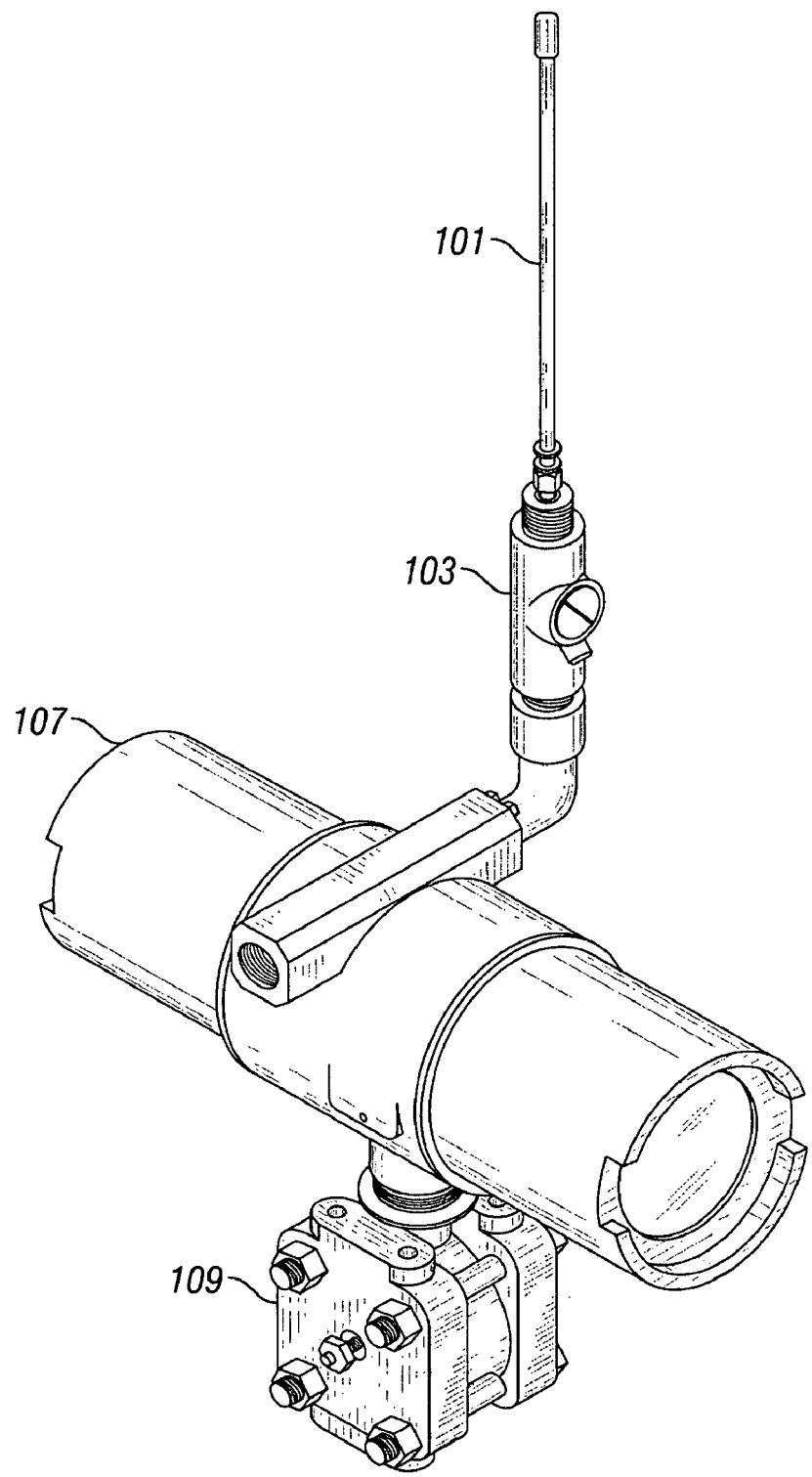
FIG. 1 shows a natural gas meter with a signal adapter according to one embodiment of the invention.

FIG. 1 shows a natural gas meter and the associated electrical equipment for use in a classified area. The natural gas meter 109 measures properties related to the volume flow rate of natural gas. The data are analyzed by an electronic device located within an explosion proof container 107. A radio transceiver (not shown) also may be located within the explosion proof container 107. The radio transceiver sends a radio signal representing the data to the antenna 101 by way of the signal adapter 103. The radio signal is then transmitted to a receiving device (not shown) that is outside the classified area. Because the antenna 101 is in a classified area but not in an explosion proof housing, the signal that the antenna 101 receives from the signal adapter 103 must be an intrinsically safe signal. That is, the signal must not be capable of igniting an explosive material, namely, natural gas.

Figure 2:
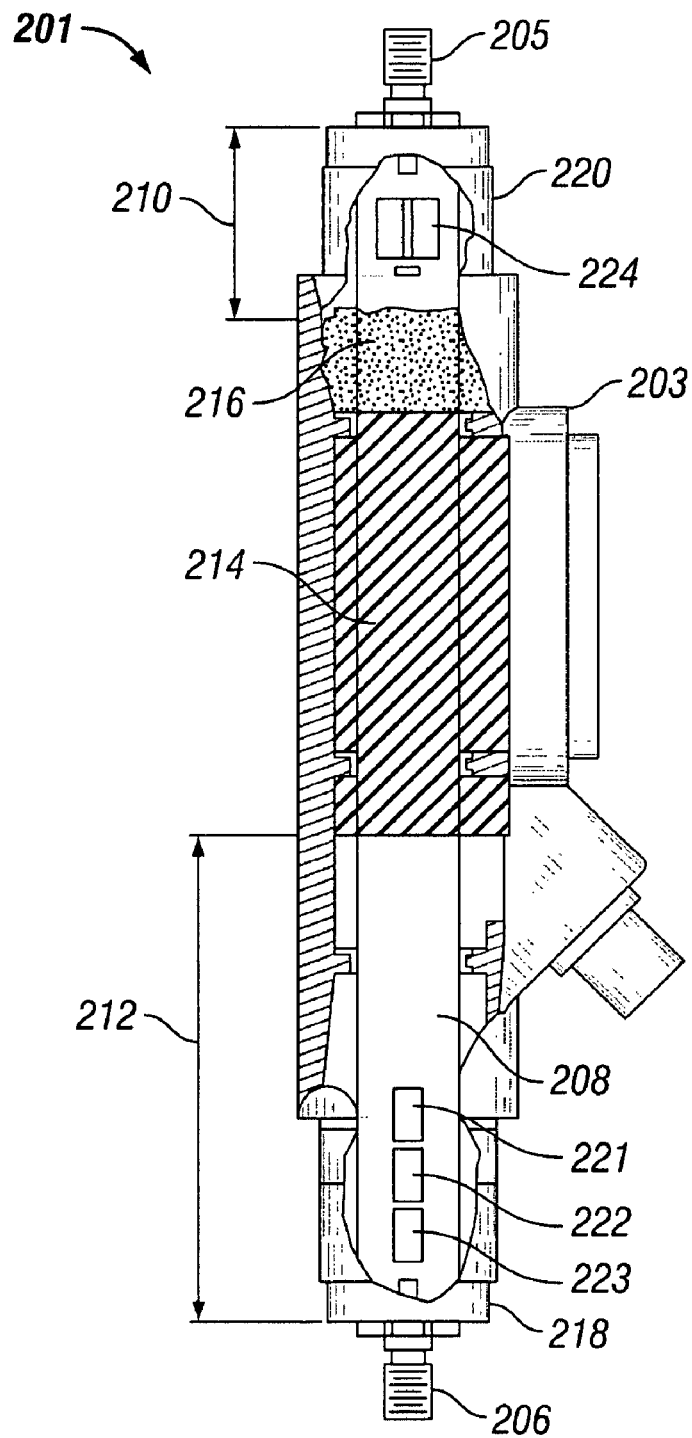
FIG. 2 shows a cut-away of one embodiment of a signal adapter.

FIG. 2 shows one embodiment of a signal adapter 201 according to the invention. The signal adapter may include an explosion proof housing 203. In the embodiments shown, the explosion proof housing 203 is a substantially cylindrical member that has a hollow interior, although other shapes may be used without departing from the scope of the invention.

A signal input connector 206 is disposed at one end of the explosion proof housing 203, and a signal output connector 205 is disposed at the other end of the explosion proof housing 203. The signal input and output connectors 206, 205 may be any type of electrical connectors that are adapted to connect with the signal source and destination, respectively. For example, the signal input connector 206 shown in FIG. 2 is a coaxial SMA connector adapted to connect to a device in an explosion proof container. An output connector 205 may be a coaxial SMA connector adapted to connect with an antenna.

The signal adapter 201 may also include a threaded pipe nipple 218 that is adapted to mate with an opening in an explosion proof housing (not shown). When the pipe nipple 218 on the signal adapter 201 is screwed into an opening in an explosion proof container (not shown), the integrity of the explosion proof container is maintained by the connection between the explosion proof housing 203 and the signal adapter 201. Other methods and devices for connecting two explosion proof containers known in the art may be used. It is noted that FIG. 2 shows a second pipe nipple 220 on the explosion proof housing, near the output connector 205. A second pipe nipple 220 is often included on standard explosion proof housings. Using a standard housing will minimize the cost. The second pipe nipple 220 is not required by the invention.

A signal adapter 201 according to the invention includes a circuit member and a seal. The seal may be disposed inside the explosion proof housing 203 and around the circuit member, thereby creating an explosion proof barrier inside the explosion proof housing 203. In order to create an explosion proof barrier, the circuit member should be impermeable to the explosive gas, at least in a portion of the circuit member surrounded by the seal. The circuit member and the seal enable an intrinsically safe electric signal to pass from inside the explosion proof barrier to outside the explosion proof barrier.

Figure 3:
FIG. 3 shows one embodiment of a printed circuit board according to another aspect of the invention.
Figure 4:
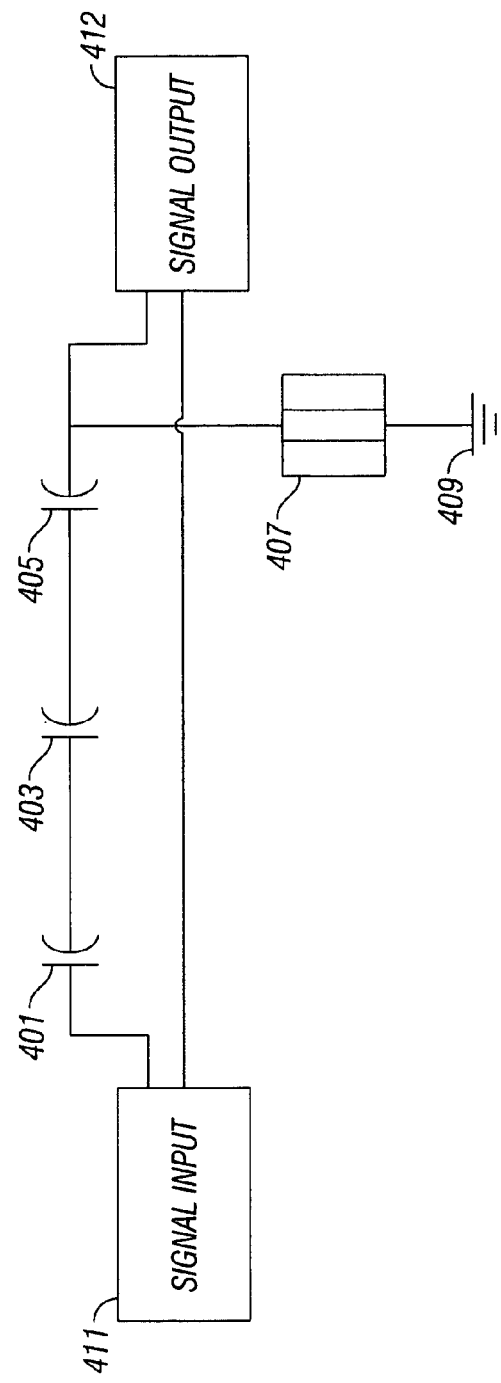
FIG. 4 shows a circuit diagram of a printed circuit board according to one embodiment of the invention

In the embodiment shown in FIG. 2, a circuit member comprises a printed circuit board 208 disposed inside the explosion proof housing 203. In one embodiment, the printed circuit board 208 comprises a two-layer glass epoxy printed circuit board. The printed circuit board 208 is electrically connected to both the signal input connector 206 and the signal output connector 205, and the printed circuit board 208 can be viewed as a waveguide with unique properties. The printed circuit board 208 may include a capacitor for ensuring that only intrinsically safe signals are transmitted to the output connector 205, but other circuit components, for example, a diode, may be used. In some embodiments, the printed circuit board 208 includes three capacitors 221, 222, 223, as shown in FIGS. 2-4. The printed circuit board 208 may also include a surge arrester. In some embodiments, a surge arrester comprises a gas tube 224. The arrangement of the components on the printed circuit board 208 are described in more detail later with reference to FIG. 3.

Also disposed inside the explosion proof housing 203 is a seal. The seal creates an explosion proof barrier between the signal input connector 206 and the signal output connector 205. In the embodiment shown in FIG. 2, the seal comprises sealing cement 214 that seals the inside of the explosion proof housing 203 and around the printed circuit board 208. Thus, the sealing cement 214 forms an explosion proof barrier so that any explosion in the explosion proof container (not shown) will be contained in the explosion proof container (not shown) and in the portion of the signal adapter 201 below the sealing cement 214. In this way, the internal assembly can be viewed as a waveguide embedded in sealing cement.

A signal adapter may also include an epoxy potting compound that fills the ends 210, 212 of the explosion proof housing 203. A potting compound protects electronic components from impact, shock, heat, moisture, and chemicals. In some embodiments, the potting compound is spark resistant so as to suppress any sparks that could cause an explosion. FIG. 2 also shows packing 216 disposed between the sealing cement 214 and the potting compound in the end of the explosion proof housing 203 near the output connector 205. The packing 216 is less rigid than the sealing cement 214 or the potting compound, and it allows a printed circuit board to bend and move slightly.

FIG. 3 shows an embodiment of a printed circuit board 301 according to one embodiment of the invention. The printed circuit board 301 is electrically connected to a signal input connector 206 and a signal output connector 205. The printed circuit board 301 will only pass intrinsically safe radio frequency signals from the input signal connector 206 to the output signal connector 205. A printed circuit board 301 may be considered as a solid conductor wire because it cannot be penetrated by gases, fumes, or dusts.

In some embodiments, a printed circuit board 301 includes three capacitors 311, 312, 313 electrically connected in series. The use of three capacitors is advantageous because safety agencies, in the process of approving a device for use in classified areas, may assume that any two components in a device will fail. By using three capacitors, a signal adapter can be approved for use in classified areas. The number of capacitors can be changed to meet safety requirements, without departing from the scope of the invention.

It is preferable that the capacitors 311, 312, 313 have a capacitance over 120 pico Farads ("pF"), so that radio frequencies, typically over 100 MHz, will be passed, but direct current ("DC") and 50-60 Hz alternating current ("AC") will be blocked. In one embodiment, the capacitors 311, 312, 313 have a capacitance of about 1,000 pF and are rated for about 5,000 V DC.

In some embodiments, the printed circuit board 301 includes a gas tube 303, as shown in FIG. 3. A gas tube 303 is a surge arrester that protects the circuit from unexpected surges, for example, such as those experienced during a lightning strike. A gas tube 303 is typically connected between the protected circuit and the electrical ground. If the potential difference between the circuit and the ground exceeds a specified, or rated, value, the gas in the gas chamber will ionize, and the circuit will be shorted to ground. In one embodiment, the gas tube 303 is a three-lead, two-chamber gas tube. The center lead may connected to the circuit, and the outer leads may connect each of the chambers to ground.

The gas tube 224, as shown in FIG. 2, is disposed on the printed circuit board 208 near the signal output connector 205. It is located above the sealing cement 214 and outside the explosion proof barrier. In the event of an electrical surge through the signal output connector 205, the electrical components inside the explosion proof container (107 in FIG. 1) will be protected by the gas tube 224.

FIG. 4 shows a circuit diagram of one embodiment of a printed circuit board. Capacitors 401, 403, 405 may be connected in series between the signal input 411 and the signal output 412. The capacitors 401, 403, 405 prevent DC and low frequency AC from being transmitted from the signal input 411 to the signal output 412. In some embodiments, the capacitors 401, 403, 405 have a capacitance of about 120 pF or higher and a DC rating of about 1,000 V. In one embodiment, the capacitors have a capacitance of about 1,000 pF, a DC rating of about 5,000 V, and are size 2215.

FIG. 4 also shows a gas tube 407, which may be included in the circuit. A gas tube 407 may be connected between the circuit and ground 409. When the potential difference between the circuit and ground 409 exceeds a certain value, for example, because of a lightning strike, gas in the gas tube 407 will ionize and short the circuit to ground 409. This will prevent an electrical surge from traveling from the signal output 412 to inside the explosion proof container (107 in FIG. 1).

Advantageously, a signal adapter according to the invention enables a intrinsically safe signal to be output from a device located inside an explosion proof container to an antenna or other device. A signal adapter enables the transmission of a signal without the need for explosion proof conduits, while maintaining the integrity of the explosion proof container.

In some embodiments, a signal adapter includes redundant three capacitors that enable the signal adapter to be certified by regulatory agencies. The capacitors allow the transmission of radio frequency signals, but block the transmission of DC and low-frequency AC signals, such as a 50-60 Hz AC power signal.

In other embodiments, a signal adapter includes a surge arrester that prevents electrical surges through an antenna from damaging components inside an explosion proof housing. Other advantages may include that a signal adapter can be enclosed in a easily obtainable explosion proof housing, such as a small section of the explosion proof conduit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A signal adapter, comprising:
   an explosion proof housing;
   a circuit member disposed on an inside of the explosion proof housing;
   a signal input connector electrically connected to the circuit member;
   a signal output connector electrically connected to the circuit member; and
   a seal disposed on the inside of the explosion proof housing and around the circuit member, creating an explosion proof seal between the signal input connector and the signal output connector,
   wherein the seal comprises two portions with one of the portions having a higher rigidity than the other portion.

2. The signal adapter of claim 1, wherein the circuit member is a printed circuit board.

3. The signal adapter of claim 2, wherein the printed circuit board comprises a two-layer glass epoxy printed circuit board.

4. The signal adapter of claim 1, wherein the circuit member comprises at least one capacitor.

5. The signal adapter of claim 4, wherein the at least one capacitor has a capacitance of at least 120 pico Farads.

6. The signal adapter of claim 4, wherein the at least one capacitor comprises three capacitors.

7. The signal adapter of claim 6, wherein the three capacitors have a capacitance of at least 120 pico Farads.

8. The signal adapter of claim 6, wherein the three capacitors have a capacitance of about 1,000 pico Farads and are rated for about 5,000 volts of direct current.

9. The signal adapter of claim 1, wherein the circuit member comprises a surge arrester.

10. The signal adapter of claim 9, wherein the surge arrester is a gas tube.

11. The signal adapter of claim 10, wherein the gas tube is a three-lead two-chamber gas tube.

12. The signal adapter of claim 1, wherein the signal input connector is adapted to be electrically connected to a radio transceiver.

13. The signal adapter of claim 1, wherein the signal output connector is adapted to be connected to an antenna.

14. The signal adapter of claim 1, wherein the input connector is a first coaxial SMA connector, and the output connector is a second coaxial SMA connector.

15. The signal adapter of claim 1, wherein the two portions of the seal comprises sealing cement and packing.

16. The signal adapter of claim 15, wherein the seal further comprises a third portion of potting compound.

17. The signal adapter of claim 1, wherein the seal is disposed substantially entirely around the circuit member to substantially encompasses the circuit member.

* * * * *